United States Patent [19]
Yaklin et al.

[11] Patent Number: 5,821,796
[45] Date of Patent: Oct. 13, 1998

[54] CIRCUITRY FOR PROVIDING A HIGH IMPEDANCE STATE WHEN POWERING DOWN A SINGLE PORT NODE

[75] Inventors: Dan Yaklin, Garland; David K. Johnson, Plano; Alan Wetzel, Parker, all of Tex.

[73] Assignee: Texas Instruments Incorporated, Dallas, Tex.

[21] Appl. No.: 717,874

[22] Filed: Sep. 23, 1996

[51] Int. Cl.[6] .................................................. H03K 5/08
[52] U.S. Cl. ........................... 327/313; 326/57; 327/534
[58] Field of Search .............................. 326/56, 57, 58, 326/86, 90; 327/313, 314, 327, 328, 534

[56] References Cited

U.S. PATENT DOCUMENTS

| | | | |
|---|---|---|---|
| 5,208,492 | 5/1993 | Masumoto et al. | 326/58 |
| 5,276,364 | 1/1994 | Wellheuer | 326/56 |
| 5,387,826 | 2/1995 | Shay et al. | 326/21 |
| 5,512,844 | 4/1996 | Nakakura et al. | 326/58 |
| 5,552,723 | 9/1996 | Shigehara et al. | 326/57 |
| 5,576,635 | 11/1996 | Partovi et al. | 326/58 |
| 5,592,510 | 1/1997 | Van Brunt et al. | 375/220 |
| 5,629,634 | 5/1997 | Carl et al. | 326/58 |

FOREIGN PATENT DOCUMENTS

| | | | |
|---|---|---|---|
| 0 480 201 A1 | 4/1992 | European Pat. Off. | H03K 19/003 |
| 0 498 377 A2 | 8/1992 | European Pat. Off. | G11C 7/00 |

*Primary Examiner*—Timothy P. Callahan
*Assistant Examiner*—Jeffrey Zweizig
*Attorney, Agent, or Firm*—Alan K. Stewart; W. James Brady, III; Richard L. Donaldson

[57] ABSTRACT

A network circuit has a single port device 28 having a high impedance output node 42 when the single port device 28 is powered down; and a multi port device 50 having a bias node 60 coupled to the output node 42.

10 Claims, 2 Drawing Sheets

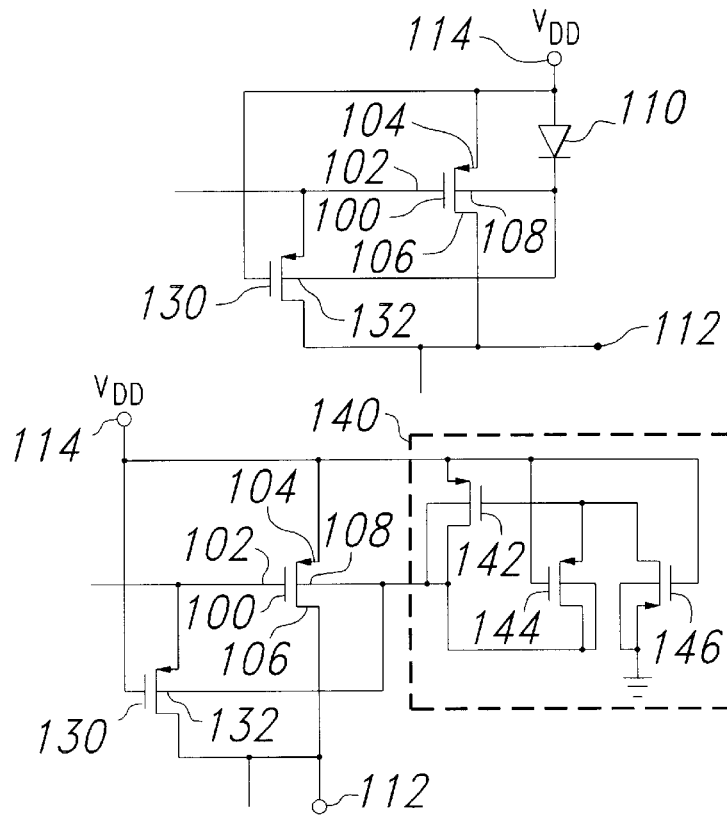
*Fig. 4*
*Fig. 5*
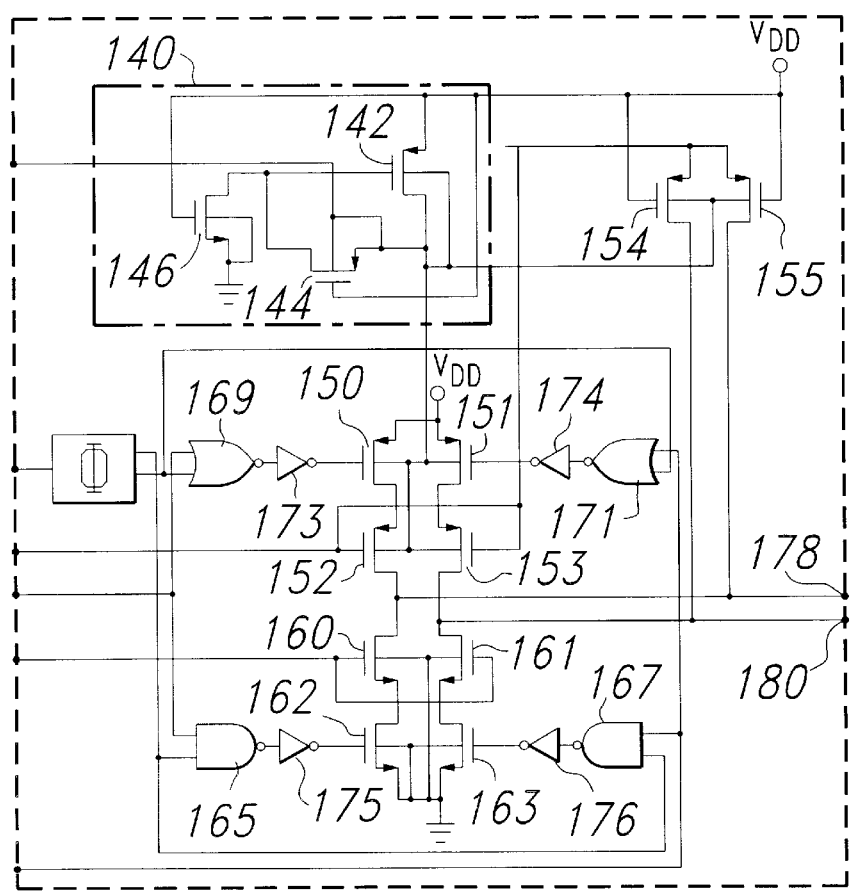
*Fig. 6*

CIRCUITRY FOR PROVIDING A HIGH IMPEDANCE STATE WHEN POWERING DOWN A SINGLE PORT NODE

FIELD OF THE INVENTION

This invention generally relates to electronic systems and in particular it relates to circuitry for providing a high impedance state when powering down a single port node.

BACKGROUND OF THE INVENTION

In IEEE P1394 network systems, single port devices are coupled to a multi port device. When one of the single port devices is powered down, it can provide a low impedance node which can pull down a bias line from the multi port device. This can cause the entire network to not operate properly. In the prior art, relays or switches have been used to isolate the powered down device from the rest of the network.

SUMMARY OF THE INVENTION

Generally, and in one form of the invention, a network circuit has a single port device having a high impedance output node when the single port device is powered down; and a multi port device having a bias node coupled to the output node.

BRIEF DESCRIPTION OF THE DRAWINGS

In drawings:

FIG. 4 is the circuit of FIG. 2 with an additional transistor;

FIG. 5 is a circuit diagram of a P channel transistor with back gate circuitry; and FIG. 6 is a circuit diagram of a preferred embodiment driver circuit.

DETAILED DESCRIPTION OF PREFERRED EMBODIMENTS

Figure 1:
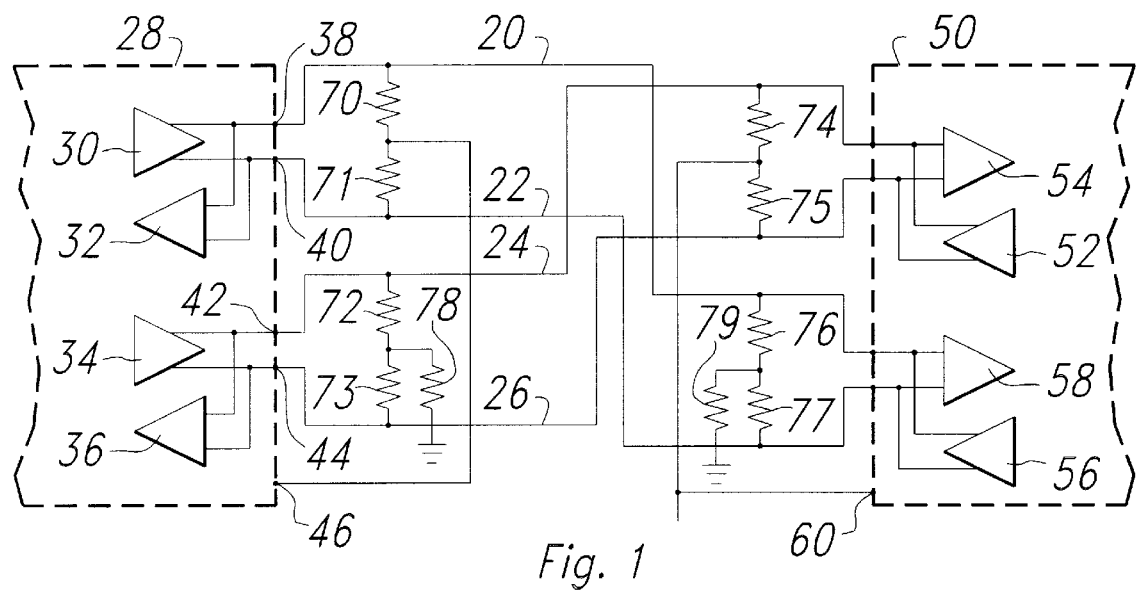
FIG. 1 is a network schematic of an IEEE P1394 system.

Shown in FIG. 1 is a network schematic of an IEEE P1394 system. The system includes twisted pair A (TPA) which includes lines 20 and 22; twisted pair B (TPB) which includes lines 24 and 26; single port physical layer device 28 which includes TPA driver 30, TPA receiver 32, TPB driver 34, TPB receiver 36, TPA nodes 38 and 40, TPB nodes 42 and 44, and TP bias node 46; multi port physical layer device 50 which includes TPA driver 52, TPA receiver 54, TPB driver 56, TPB receiver 58, and TP bias node 60; and resistors 70–79. In the preferred embodiment, resistors 70–77 have a resistance of 55 ohms and resistors 78 and 79 have a resistance of 5K ohms.

When the single port device 28 is powered down and does not receive cable power to keep the device operating, the powered down device 28 pulls down the TP bias from node 60 on the device it is connected to (multi port device 50). This causes the other ports of multi port device 50 to not operate properly and can bring down the entire network. In the prior art, a relay or switch was used to isolate the powered down device from the rest of the network.

When the single port device 28 is powered down, a low input impedance exists on the TPB nodes 42 and 44. This low impedance is created by the TPA and TPB drivers 30 and 34. TP bias from node 60 is coupled to node 42 through resistor 74 (55 ohms in the preferred embodiment). This creates a low impedance which can overload the TP bias from node 60 of the multi port device 50. The preferred embodiment solves this low impedance problem by providing a high impedance at the TPA and TPB nodes 38, 40, 42, and 44 when the device 28 is powered down.

Figure 2:
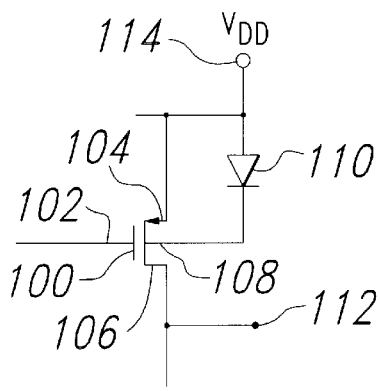
FIG. 2 is a circuit diagram of a P channel transistor with a diode coupled to the back gate.
Figure 3:
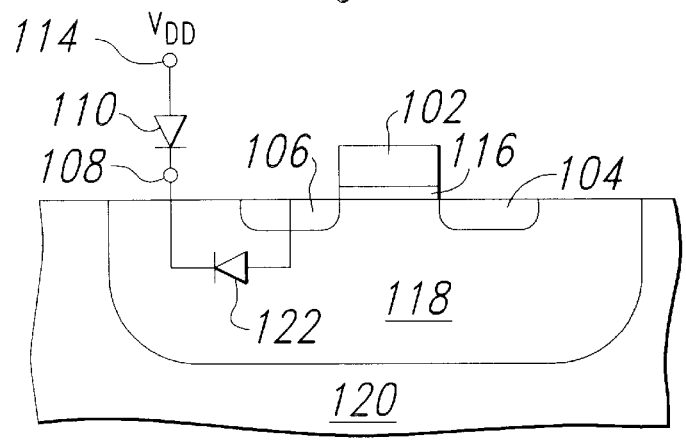
FIG. 3 is a semiconductor cross section of the circuit of FIG. 2.

The source of the low impedance is P channel devices, such as shown in FIGS. 2 and 3, within the drivers 30 and 34 connected to the TPA and TPB nodes 38, 40, 42, and 44. FIG. 2 is a circuit diagram of a P channel transistor 100 as found in drivers 30 and 34. P channel transistor 100 is the semiconductor device shown in FIG. 3. The circuit of FIG. 2 includes transistor 100, gate 102, source 104, drain 106, back gate 108, diode 110, TPA/TPB node 112, and $V_{DD}$ node 114. The semiconductor device of FIG. 3 includes gate 102, P type drain 106, P type source 104, insulator region 116, N type region 118, P type region 120, back gate node 108, diode 110, $V_{DD}$ node 114, and parasitic diode 122. The low impedance path is from the drain 106 to the back gate connection 108, which is tied to $V_{DD}$. The low impedance occurs when $V_{DD}$, is powered down and current flow is in the direction from the drain 106 to the back gate 108. By inserting a series diode 110 between the back gate 108 and the $V_{DD}$ node 114, the problem is solved.

Another potential path exists through the drain 106 to source 104 path. If the voltage on gate 102 stays low, the transistor 100 can still turn on when the voltage on drain 106 is raised. To solve this problem, another P channel transistor 130 can be added to bias up the gate 102 to the potential on the TPA or TPB nodes, as shown in FIG. 4. The circuit in FIG. 4 includes transistor 130 coupled to the circuit of FIG. 2. The back gate 132 of transistor 130 is also coupled to diode 110 to prevent a low impedance path through transistor 130.

A second embodiment, shown in FIG. 5, provides another solution to the back gate problem. The circuit of FIG. 5 includes transistors 100 and 130 of FIG. 4 along with circuit 140, which takes the place of diode 110 in FIG. 4. Circuit 140 includes transistors 142, 144, and 146. This circuit provides a high impedance at the drain 106 when $V_{DD}$ is powered down. The circuit in FIG. 5 can provide back gate bias to all P channels in the driver, especially if multiple P channels are in the same tank.

A preferred embodiment driver circuit is shown in FIG. 6. This circuit uses the back gate circuit 140, shown in FIG. 5. The driver circuit includes back gate circuit 140, P channel transistors 150–155, N channel transistors 160–163, nand gates 165 and 167, nor gates 169 and 171, inverters 173–176, and TPA nodes 178 and 180. The back gate circuit 140 is coupled to the back gates of all P channel transistors 150–155 in the driver circuit. Transistors 154 and 155 serve the same purpose as transistor 130 in FIGS. 4 and 5.

Preferred embodiments have been described in detail hereinabove. It is to be understood that the scope of the invention also comprehends embodiments different from that described, yet within the scope of the claims. For example, transmission gates can be used to help isolate the circuit under power down conditions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A driver circuit having a high impedance output node when powered down comprising:
   a first transistor having a drain, a gate, a source, and a back gate, the drain is coupled to the output node;
   a second transistor having a drain coupled to the back gate;
   a third transistor having a drain coupled to the back gate, a source coupled to a gate of the second transistor, and a gate coupled to a source of the second transistor; and
   a fourth transistor having a drain coupled to the gate of the second transistor and a gate coupled to the source of the second transistor.

2. The circuit of claim 1 further comprising circuitry coupled to the gate to bias the gate to a potential on the output node to minimize current flow from the drain to the source.

3. The circuit of claim 2 wherein the circuitry coupled to the gate comprises a fifth transistor having a source coupled to the gate and a drain coupled to the output node.

4. The circuit of claim 1 wherein the driver circuit is in a single port device coupled to a multi port device.

5. The circuit of claim 1 wherein the output node is coupled to a bias node of a multi port device through a resistor.

6. A circuit for providing a high impedance output node when powered down comprising:
   a first MOSFET having a drain coupled to the output node;
   a second MOSFET having a drain coupled to the back gate;
   a third MOSFET having a drain coupled to the back gate, a source coupled to a gate of the second MOSFET, and a gate coupled to a source of the second MOSFET;
   a fourth MOSFET having a drain coupled to the gate of the second MOSFET and a gate coupled to the source of the second MOSFET; and
   a multi port network device coupled to the output node.

7. The circuit of claim 6 wherein the first MOSFET is a P channel MOSFET.

8. The circuit of claim 6 wherein the second MOSFET is a P channel MOSFET.

9. The circuit of claim 6 wherein the third MOSFET is a P channel MOSFET.

10. The circuit of claim 6 wherein the fourth MOSFET is an N channel MOSFET.

* * * * *